(12) United States Patent
Hackenberger et al.

(10) Patent No.: US 8,894,765 B1
(45) Date of Patent: Nov. 25, 2014

(54) HIGH POLARIZATION ENERGY STORAGE MATERIALS USING ORIENTED SINGLE CRYSTALS

(75) Inventors: Wesley S. Hackenberger, State College, PA (US); Edward F. Alberta, State College, PA (US)

(73) Assignee: TRS Technologies, Inc., State College, PA (US)

( * ) Notice: Subject to any disclaimer, the term of this patent is extended or adjusted under 35 U.S.C. 154(b) by 1049 days.

(21) Appl. No.: 12/945,390

(22) Filed: Nov. 12, 2010

Related U.S. Application Data

(60) Provisional application No. 61/260,957, filed on Nov. 13, 2009.

(51) Int. Cl.
*C30B 1/02* (2006.01)

(52) U.S. Cl.
USPC ............................ 117/4; 117/5; 117/8; 117/9

(58) Field of Classification Search
USPC .................................................. 117/4, 5, 8, 9
See application file for complete search history.

(56) References Cited

U.S. PATENT DOCUMENTS

| | | | |
|---|---|---|---|
| 4,412,148 | A | 10/1983 | Klicker et al. |
| 5,702,629 | A | 12/1997 | Cui et al. |
| 6,685,849 | B2 | 2/2004 | Eitel et al. |
| 7,989,530 | B2 | 8/2011 | Tan et al. |
| 8,148,877 | B2 | 4/2012 | Jiang et al. |
| 2006/0079785 | A1* | 4/2006 | Hosono et al. .............. 600/459 |
| 2008/0309198 | A1* | 12/2008 | Van Tol et al. ................ 310/333 |
| 2009/0273257 | A1* | 11/2009 | Ifuku et al. .................... 310/360 |
| 2011/0074249 | A1 | 3/2011 | Sakashita et al. |
| 2012/0145943 | A1 | 6/2012 | Tan et al. |

FOREIGN PATENT DOCUMENTS

JP 72022518 B 7/1972

OTHER PUBLICATIONS

D. Berlincourt, H. H. A. Krueger and B. Jaffe, "Stability of Phases in Modified Lead Zirconate with Variation in Pressure", Electric Field, Temperature and Composition Electronic Research Division, Clevite Corporation, Cleveland, Ohio, (Received May 15, 1963; in revised form Nov. 22, 1963), J. Phys. Chem. Solids Pergamon Press 1964. vol. 25, pp. 659-674. Printed in Great Britain.

Ui-Jin Chung, Jong-Keuk Park, Nong-Moon Hwang,Ho-Yong Lee, and Doh-Yeon Kim; "Effect of Grain Coalescence on the Abnormal Grain Growth of Pb(Mg1/3Nb2/3)O3-35 mol% PbTiO3", Ceramics Center for Microstructure Science of Materials and School of Materials Science and Engineering, J. Am. Ceram. Soc., 85 [4] 965-68 (2002), Seoul National University, Seoul 151-744, Korea.

R. H. Dungan, H. M. Barnett, and A. H. Stark, "Phase Relations and Electrical Parameters in the Ferroelectric—Antiferroelectric Region of the System PbZrO,-PbTi0,-PbN b,06", Journal of the American Ceramic Society-Dungan et al. vol. 45, No. 8, Sandia Corporation, Albuquerque, New Mexico.

(Continued)

*Primary Examiner* — Bob M Kunemund
(74) *Attorney, Agent, or Firm* — McNees Wallace & Nurick LLC

(57) ABSTRACT

A PIN-PMN-PT ferroelectric single crystal and a method of manufacture are disclosed. The PIN-PMN-PT ferroelectric single crystal is oriented and polarized along a single crystallographic direction. The PIN-PMN-PT ferroelectric single crystal ferroelectric has increased remnant polarization.

13 Claims, 4 Drawing Sheets

(56) References Cited

OTHER PUBLICATIONS

Razvan Caracasa and R. E. Cohen, "Prediction of polar ordered oxynitride perovskites", Received Jul. 17, 2007; accepted Aug. 6, 2007; published online Aug. 27, 2007, Applied Physics Letters 91, 092902 2007.

E.F. Alberta, B. Michaud, W.S. Hackenberger, B. Freeman, D. J. Hemmert, A. H. Stults, and L. L. Altgilbers, "Development of Ferroelectric Materials for Explosively Driven Pulsed-Power Systems", 9781-4244-4065-8/09/$25.00 © 2009 IEEE Authorized licensed use limited to: Penn State University.

S. C. Abrahams, S. K. Kurtz, and P. B. Jamieson, "Atomic Displacement Relationship to Curie Temperature and Spontaneous Polarization in Displacive Ferroelectrics", (Received Feb. 28, 1968) Physical Review vol. 172, No. 2 Aug. 10, 1968, Bell Telephone Laboratories, Murray Hill, New Jersey.

Ilya Grinberg, Matthew R. Suchomel, Peter K. Davies, and Andrew M. Rappe, "Predicting morphotropic phase boundary locations and transition temperatures in Pb- and Bi-based perovskite solid solutions from crystal chemical data and first-principles calculations", Journal of Applied Physics 98, 094111 2005 Received Mar. 24, 2005; accepted Sep. 4, 2005; published online Nov. 11, 2005

W. J. Halpin, "Current from a Shock-Loaded Short-Circuited Ferroelectric Ceramic Disk", Journal of Applied Physics vol. 37. No. Jan. 1, 1966, (Received Jun. 14, 1965), Sandia Laboratory, Albuquerque, New Mexico.

Seung-Eek Parka and Thomas R. Shrout, "Ultrahigh strain and piezoelectric behavior in relaxor based ferroelectric single crystals", Materials Research Laboratory, The Pennsylvania State University, University Park, Pennsylvania 16802, Received Mar. 20, 1997; accepted for publication May 12, 1997.

C. E. Reynolds and G. E. Seay, "Two-Wave Shock Structures in the Ferroelectric Ceramics Barium Titanate and Lead Zirconate Titanate", Journal of Applied Physics vol. 33, No. 7, Jul. 1962, Received Jan. 8, 1962 Los Alamos Scientific Laboratory, Los Alamos, New Mexico.

Masaru Yokosuka and Hidehiko Kojima, "Dielectric and Piezoelectric Properties of the Solid Solution System $PB(Fe2/3\ WI/3)03$-$PbZr03$", Jpn. J. Appl. Phys. vol. 36 (1997) pp. 6046-6050. Part 1, No. 9B, Sep. 1997, Received May 6, 1997; accepted for publication Jul. 4, 1997, Faculty of Science and Engineering, Iwaki-Meisei University, Iwaki, Fukushima 970, Japan.

W. Neilson, Bulletin of the American Physical Society, vol. 2, p. 302, 1957.

D. F. Dzhmukhadze, Yu. N. Venevtsev and G. S. Zhdanov The System $PbTio$—$SrCu1/3Nb2/3O3$ Soviet Physics—Crystallography vol. 16, No. 1 Jul.-Aug. 1971.

Altgilbers, L.L., "Recent Advances in Explosive Pulsed Power," Electromagnetic Phenomena V.3. No. 4 (12), (2003) U.S. Army Space and Missile Defense Command, Huntsville, AL.

Ng et al., "Piezoelectric and Pyroelectric Properties of PZT/P(VDF-TrFE) Composites with Constituent Phases Poled in Parallel or Antiparallel Directions," IEEE Transactions on Ultrasonic, Ferroelectrics, and Frequency Control, vol. 47, No. 6, Nov. 2000, pp. 1308-1315.

Zeuch et al., "Uniaxial compression experiments on lead zirconate titanate 95/5-2Nb ceramic: Evidence for an orientation-dependent, 'maximum compressive stress' criterion for onset of the ferroelectric to antiferroelectric polymorphic transformation," J. Mater, Res., vol. 15, No. 3, Mar. 2000, pp. 689-703.

Hwang et al., "Low-Temperature Sintering and High Strength $Pb(Zr,Ti)O3$—Matrix Composites Incorporating Silver Particles, "J. Am. Ceram. Soc., 80, 3, 1997 (no month date), pp. 791-793.

Yoshikawa et al., "Piezoelectric PZT Tubes and Fibers for Passive Vibrational Damping," Proceedings of the Eighth IEEE Internaitonal Symposium on Applications of Ferroelectrics, 1992, ISAF '92, Aug. 30-Sep 2, 1992, pp. 269-272.

\* cited by examiner

HIGH POLARIZATION ENERGY STORAGE MATERIALS USING ORIENTED SINGLE CRYSTALS

CROSS-REFERENCE TO RELATED APPLICATIONS

This application claims priority to U.S. Provisional Patent Application No. 61/260,957 filed on Nov. 13, 2009, entitled "HIGH POLARIZATION ENERGY STORAGE MATERIALS" which is herein incorporated by reference in its entirety.

STATEMENT OF FEDERALLY SPONSORED RESEARCH

Portions of the invention disclosed herein were reduced to practice with the support of the U.S. Army Space and Missile Command, Contract No. W9113M-09-C-0011. The U.S. Government may have certain rights in this invention.

FIELD

The present invention is generally directed to energy storage materials and, more particularly, to single crystal ferroelectric materials for energy storage.

BACKGROUND

Directed energy technology is being developed for a broad range of applications including both lethal and non-lethal weapons, burst communications, and explosion diagnostics. These systems use a pulse power generator to provide a burst of energy to an energy projection system such as a laser, a radio frequency (RF) antenna, or a microwave frequency (MW) antenna. A variety of generators have been developed for single shot systems. One type, known as a ferroelectric generator (FEG), uses conventional explosives to launch a shock wave into a piece of polarized ferroelectric ceramic. The shock wave causes the ceramic to depolarize, liberating a large amount of charge that is then available to do work such as drive an RF or MW antenna. FEGs are compact, inexpensive power sources that are particularly attractive for highly space-constrained applications.

The current, state-of-the-art FEG material is a piezoelectric ceramic based on Type I lead zirconate titanate (PZT) material having the composition $Pb(Zr_{0.52},Ti_{0.48})O_3$, which can generally be referred to as Type I PZT. This material is a polycrystalline aggregate that does not completely depolarize during shock, or in other words, the fractional amount of depolarization $\alpha$, that occurs during shock is less than 1. Most often, this material has a moderate remnant polarization $P_r$ of about 20 to 25 $\mu C/cm^2$ (C=coulombs), and a dielectric constant $\in_r$ greater than about 1000. Most Type I PZT materials have breakdown strengths ranging from 30 to 100 kV/cm.

Another FEG material is $Pb(Zr_{0.95},Ti_{0.05})O_3$ ceramic, otherwise known as 95/5 PZT. This material is not generally available commercially. Like the Type I PZT-Pb $(Zr_{0.52},Ti_{0.48})O_3$ material, 95/5 PZT ceramic is a polycrystalline aggregate of randomly oriented, micrometer-sized crystallites. This material undergoes a phase transition to a non-polarized anti-ferroelectric state during sufficiently strong shock events. This causes complete, instantaneous depolarization, so that the fractional amount of depolarization $\alpha=1$. Also, when this material is doped with a small amount of $Nb^{5+}$ in place of $Zr^{4+}$ and $Ti^{4+}$ the material has a high $P_r$ in the range of 39 to 40 $\mu C/cm^2$. This material has a dielectric constant $\in_r$ in the range of 300 to 400. Similar to the Type I PZT materials, this material also has breakdown strengths ranging from 30 to 100 kV/cm.

What is needed to improve FEG performance is a ferroelectric material with an improved remnant polarization $P_r$, which provides more charge for the intended application and can lead to the generation of higher electric fields during shock discharge, thus increasing component energy density.

SUMMARY

The present invention provides a single crystal $xPb(In_{1/2}Nb_{1/2})O_3$-$yPb(Mg_{1/3}Nb_{2/3})O_3$-$zPbTiO_3$ (PIN-PMN-PT) with $0 \leq x \leq 0.5$, $0 \leq y \leq 1$, and $0.2 \leq z \leq 0.6$ oriented and polarized along the <111> crystallographic directions when the crystal composition corresponds to the rhombohedral phase field, oriented and polarized along the <011> crystallographic directions when the crystal composition is in the orthorhombic phase field, and oriented and polarized along the <001> crystallographic directions when the crystal composition corresponds to the tetragonal phase field. Crystals exhibiting these compositions, orientations, and phases (symmetry classes) exhibit high remnant polarization ($P_r$) resulting in increased electrical charge generation during mechanically induced shock-discharge in comparison to ceramic ferroelectrics such as Type I PZT and 95/5 PZT.

The crystals described above can be fabricated by a variety of methods including solidification from a melt using modified Bridgman or Czochralski methods, solidification from a solution using the flux or top seeding methods, solid state conversion of a ceramic to a single crystal using a bonded crystal seed, or any other method that with a single crystal as its output.

An advantage of the present invention is to provide a single crystal ferroelectric material having a higher remnant polarization than 95/5 PZT and commercial PZT. This results in more electric charge released during mechanical shock which, in turn, can be used to generate more energy per unit volume of the ferroelectric material. This increased energy output density can be used to improve the performance of explosive generator systems or to decrease their size.

Other features and advantages of the present disclosure will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF EXEMPLARY EMBODIMENTS

The open circuit energy density generated by a mechanically shocked ferroelectric is given by $$e = \alpha P_r E \quad (1)$$

where e is the energy density in Joules per cm$^3$ of ferroelectric material, $\alpha$ is a fraction between 0 and 1 indicating the amount of depolarization that occurred during the shock, $P_r$ is the ferroelectric's remnant polarization in C/cm$^2$, and E is the electric field in V/cm generated across the ferroelectric by the depolarizing shock. The maximum electric field that can be generated in a shock event is in turn given by $$E = \alpha P_r / \in_r \in_o \quad (2)$$

where $\in_r$ is the relative permittivity (dielectric constant) of the shocked material and $\in_o$ is the permittivity of free space. In practice, E rarely gets as high as this equation would suggest and is limited by dielectric breakdown of the ferroelectric during the shock event (typically 50 to 100 kV/cm for ceramic materials).

From equations (1) and (2), it can be seen that a ferroelectric will have a high shock discharge energy density if it 1) has a high $P_r$, 2) has an $\alpha$=1, 3) has a high voltage breakdown strength enabling a high E, and 4) has a low permittivity $\in_r \in_o$.

Ferroelectric ceramics consist of a large number of randomly oriented crystallites and therefore exhibit a $P_r$ that is an average of polarizations from crystallographic directions with both high and low values. Thus the $P_r$ for a ceramic will always be less than that obtained from a single crystal of the same composition oriented along the direction with the maximum $P_r$ for a particular material. For ferroelectric crystals exhibiting the perovskite crystal structure with rhombohedral symmetry, <111> is the polar axis and, therefore, the crystallographic direction that exhibits maximum $P_r$. PZT based materials have been known to have some of the highest $P_r$'s measured for a ferroelectric material. Unfortunately, it is extremely difficult to make PZT single crystals as commercially viable materials. So called relaxor ferroelectrics such as PMN-PT can be grown in commercially viable sizes (>2" in diameter by >3" long), but the $P_r$'s of these materials are usually not as high as PZT. This invention concerns compositional modifications to PMN-PT relaxor ferroelectric single crystals through the addition of PIN and orientations of said crystals that exhibit $P_r$'s higher than PZT ceramics.

Figure 1:
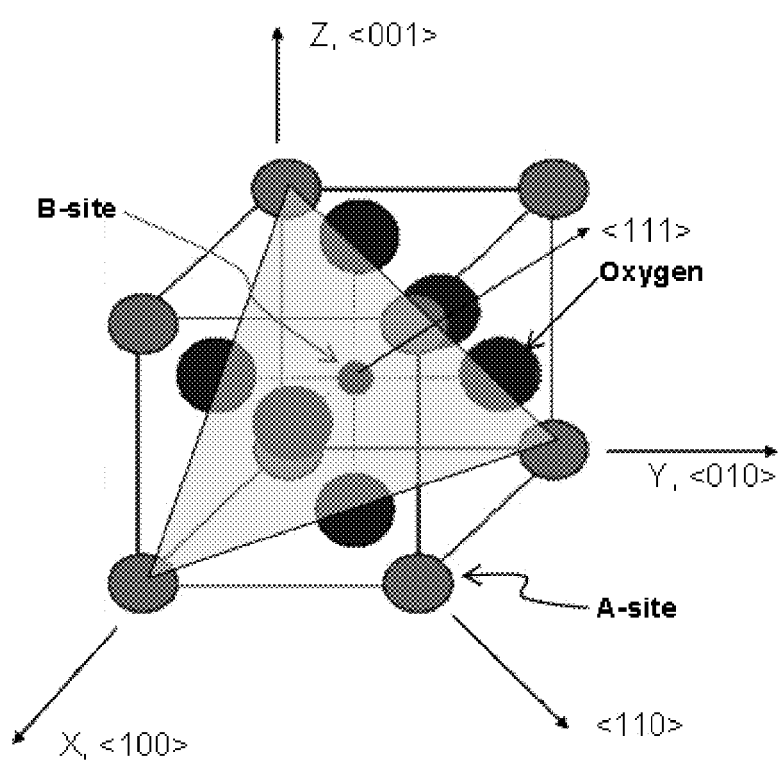
FIG. 1 illustrates is a schematic of the cubic perovskite crystal unit cell showing the locations of the A and B-site cations and the oxygen anions and indicating the principal crystallographic directions.

The perovskite family of complex oxides, which is comprised of compounds, have the general formula $A^{[XII]}B^{[VI]}O_3$. The superscripts in these formulas refer to coordination numbers of the "A-site" and "B-site" cations. The coordination number is the number of nearest neighbor oxygen anions that surrounds each cation in the perovskite crystal structure. The subscripts refer to the ionic molar ratios of the crystal lattice sites (A, B, and oxygen). The A-site cation is generally a 1+, 2+ or 3+ valance ion such as $K^{1+}$, $Pb^{2+}$ or $Be^{3+}$ The B-site can accommodate a broad range of 2+, 3+, 4+, 5+, and 6+ ions in stoichiometric combinations. An example of a perovskite ferroelectric is 95/5 PZT, a typical formula for which is $Pb_{0.99}(Zr_{0.95}Ti_{0.05})_{0.98}Nb_{0.02}O_3$. A schematic of a cubic perovskite crystal lattice unit cell is shown in FIG. 1.

Ferroelectric perovskites generally have a cubic structure at high temperature, but on cooling they undergo a phase transition to a lower symmetry crystal structure such as tetragonal, rhombohedral, orthorhombic, or monoclinic. These lower symmetry crystal structures exhibit a spontaneous polarization that is re-orientable with electric field and mechanical stress. The phase transition temperature is called the Curie temperature ($T_c$). The origin of the spontaneous polarization is the displacements, $\Delta z$, of the A and B-site cations from their high temperature equilibrium positions. On cooling below $T_c$, a ferroelectric crystal will subdivide into small regions of uniform polarization with the polarization vectors in each region oriented so that the summation of polarizations of all the regions in the crystal is approximately zero. These regions are called domains. Domains form to prevent the build-up of a large electrostatic potential across the crystal that would be present if all the spontaneous polarization in a ferroelectric crystal aligned in one direction. However, despite the formation of domains, the spontaneous polarization can still be aligned by the application of a large electric field across the material. The resulting net polarization that remains after removal of the electric field is the remnant polarization, $P_r$. For single crystals the crystallographic direction in which $P_r$ is maximum depends on the symmetry of the crystal which, in turn, depends on composition. For rhombohedral crystals the directions with maximum $P_r$ belong to the <111> family of directions. The directions for orthorhombic symmetry are <011> and for tetragonal symmetry they are <001>.

The present invention is directed to the fabrication of ferroelectric single crystals which can be oriented to yield higher $P_r$ than can be achieved in prior art ceramics. These single crystals can be used to form shock discharge elements with increased energy density. In an embodiment, PIN modified PMN-PT ferroelectric single crystal are oriented and polarized along a crystallographic direction selected from the group consisting of <111>, <001>, <110>, and rotations between <001> and <111> crystallographic directions. In an embodiment, PIN modified PMN-PT single crystals with compositions corresponding to a phase field exhibiting rhombohedral symmetry are oriented and polarized along the <111> crystallographic direction, which has been found by the inventors to unexpectedly result in $P_r$ that is considerably higher than ferroelectric ceramic materials.

The single crystals of the present invention provide for high energy density due to high remnant polarization. In an embodiment, the single crystals of the present invention are oriented and polarized singularly along the <111> crystallographic direction. Orienting and polarizing along the <111> crystallographic direction results in the highest possible $P_r$ for a rhombohedral ferroelectric, which some compositions of PIN-PMN-PT are examples. Furthermore, single crystals of the present invention provide for high shock induced electric charge release resulting in high energy density ferroelectric generators. The single crystals of the present invention also provide for reduced FEG size, which allows for the placement of these devices on very small platforms.

As an example according to the invention, a single crystal with composition 26% PIN-44% PMN-30% PT, which has a rhombohedral crystal structure, is provided. The spontaneous polarization for rhombohedral crystals lies along the <111> crystallographic direction (see FIG. 1). Therefore, the displacement of the A and B-site cations from their equilibrium cubic positions will be largest along <111> and, thus, the remnant polarization $P_r$ will be largest for a crystal oriented and polarized along <111>. Ceramic materials such as 95/5 PZT are aggregates of micrometer sized, randomly oriented crystallites. Therefore, the properties of a ceramic represent averages of properties along all crystallographic directions.

One aspect of this invention is to grow PIN-PMN-PT rhombohedral single crystals having the crystals oriented along the <111> crystallographic direction, and polarizing the crystals along the <111> crystallographic direction, which results in increased $P_r$ compared to ceramic. The single crystals can be grown by a variety of methods including, but not limited to, flux growth, Bridgman growth, top seeded solution growth, Czochralski growth, solid state crystal growth, and templated grain growth.

In one embodiment of the invention, the single crystals are grown by solid state growth. In this method a crystal seed with the desired orientation and crystallographic lattice parameter similar to PIN-PMN-PT is bonded to the surface of dense PIN-PMN-PT ceramic. The ceramic is heat treated allowing the crystal seed to nucleate the growth of a crystal into the ceramic. The ceramic can be synthesized using any number of well known ceramic powder synthesis and ceramic forming processes. Ceramic powder synthesis processes include, but are not limited to, mixed oxide or hydroxide or carbonate solid state reaction; sol-gel synthesis; precipitation of hydroxides, carbonates, oxides, and hydroxycarbonates; coprecipitation; hydrothermal synthesis; spray pyrolosis; and flame pyrolosis. Ceramic forming methods include, but are not limited to, uniaxial dry pressing, cold isostatic pressing, tape casting, injection molding, extrusion, pressure casting, slip casting, sintering, hot pressing, and hot isostatic pressing.

In one embodiment, single crystals are formed by using high purity oxide starting powders which are mixed in an aqueous suspension, heat treated to form the perovskite crystal structure, milled to reduce particle size, dry pressed to form a ceramic shape and heat treated (sintered) to form a dense ceramic. In another embodiment, single crystals are formed by hot pressing a ceramic powder. In yet another embodiment, single crystals are formed by hot isostatically pressing the ceramic after sintering ceramic powders.

According to an embodiment of the invention, single crystals are grown in a crystallographic direction that results in a high $P_r$. In an embodiment, single crystals are grown along the <111> crystallographic direction. In another embodiment, single crystals are grown in a <001>, a <110>, or in rotations between <001> and <110> crystallographic directions.

Another embodiment of the invention is to grow single crystals with the general formulation $xPb(In_{1/2}Nb_{1/2})O_3$-$yPb(Mg_{1/3}Nb_{2/3})O_3$-$zPbTiO_3$ with $0 \le x \le 0.5$, $0 \le y \le 1$, and $0.2 \le z \le 0.6$. In one embodiment, x=0.26, y=0.44, and z=0.30. In another embodiment, an effective amount of PbO additions are made to $xPb(In_{1/2}Nb_{1/2})O_3$-$yPb(Mg_{1/3}Nb_{2/3})O_3$-$zPbTiO_3$ to facilitate crystal growth. The PbO may be added in an amount greater than zero and up to 10 mol %.

According to an embodiment of the invention, xPIN-yPMN-zPT crystals with rhombohedral symmetry and oriented and polarized along any of the <111> crystallographic directions. Crystals representative of these embodiment have compositions with x ranging from approximately 0 to approximately 0.5, z ranging from approximately 0.2 to approximately 0.3 and y making up the balance between x and z (y=1−(x+z)).

According to another embodiment, xPIN-yPMN-zPT crystals, with x ranging from approximately 0 to approximately 0.5, z ranging from approximately 0.3 to approximately 0.36 and y making up the balance between x and z, and with orthorhombic symmetry are oriented and polarized along any of the <011> crystallographic directions.

According to another embodiment, xPIN-yPMN-zPT crystals, with x ranging from approximately 0 to approximately 0.5, z ranging from approximately 0.36 to approximately 0.6 and y making up the balance between x and z, and with tetragonal symmetry are oriented and polarized along any of the <001> crystallographic directions.

In another embodiment, a single crystal grown in a first direction and oriented in the same or different direction as needed for a particular application. In an embodiment, a single crystal is grown in a <111> direction and oriented and poled in a <111> direction. In an embodiment, a single crystal is grown in a <011> direction and oriented and poled in a <111> direction. In an embodiment, a single crystal is grown in a <001> direction and oriented and poled in a <111> direction. In an embodiment, a single crystal is grown in a <111> direction and oriented and poled in a <011> direction. In an embodiment, a single crystal is grown in a <111> direction and oriented and poled in a <001> direction. In an embodiment, a single crystal is grown in a <011> direction and oriented and poled in a <011> direction. In an embodiment, a single crystal is grown in a <011> direction and oriented and poled in a <001> direction. In an embodiment, a single crystal is grown in a <001> direction and oriented and poled in a <001> direction. In an embodiment, a single crystal is grown in a <001> direction and oriented and poled in a <011> direction.

For example, a rhombohedral crystal grown by the solid state method in a <011> crystallographic direction may be oriented in the polar <111> direction. In this particular example, solid state growth along <011> will result in a larger overall crystal than if it were grown along <111>; however, since the crystal is rhombohedral, orienting and poling along <111> yields the largest remnant polarization.

Figure 2:
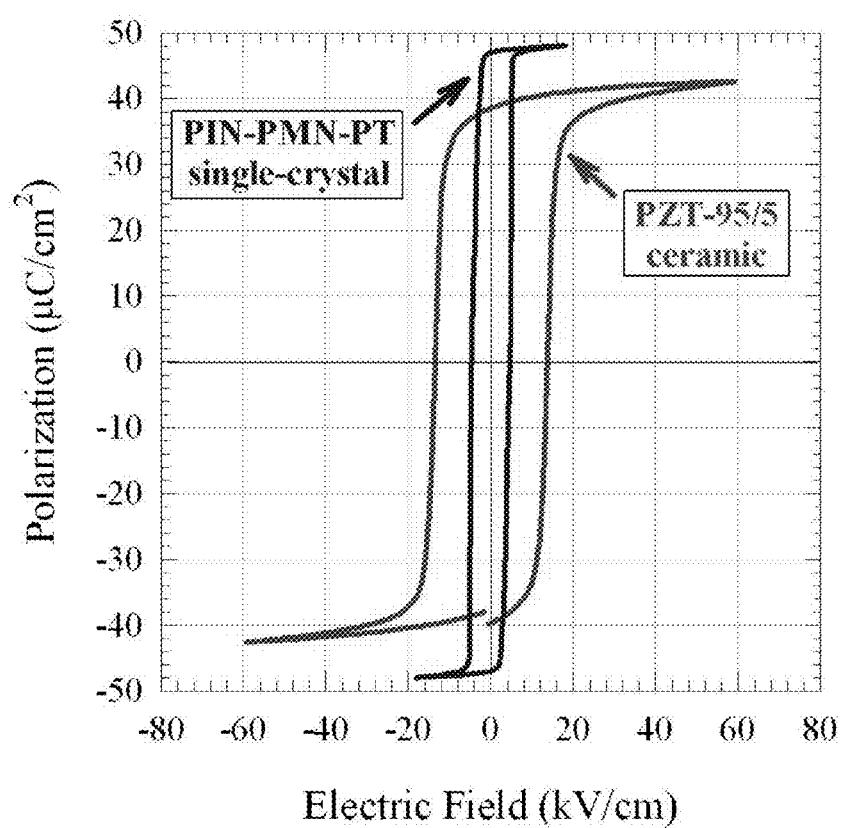
FIG. 2 shows electric charge/discharge test results comparing polarization and electric field hysteresis curves for a rhombohedral PIN-PMN-PT single crystal oriented along a <111> direction and a standard ceramic material.

FIG. 2 shows test results comparing polarization and electric field hysteresis loops for a 0.26PIN-0.44PMN-0.30PT single crystal oriented along a <111> direction and a 95/5 PZT ceramic material. As can be seen in FIG. 2, the remnant polarization value for the single crystal material is significantly larger than that of the standard ceramic (47 $\mu C/cm^2$ v. 38 $\mu C/cm^2$). This indicates that the single crystal will produce more electric depolarization charge per unit area compared to the 95/5 PZT ceramic which, in turn, will allow a single crystal based generator to deliver more energy to an electrical load than could be accomplished with 95/5 PZT ceramic generator.

Figure 3:
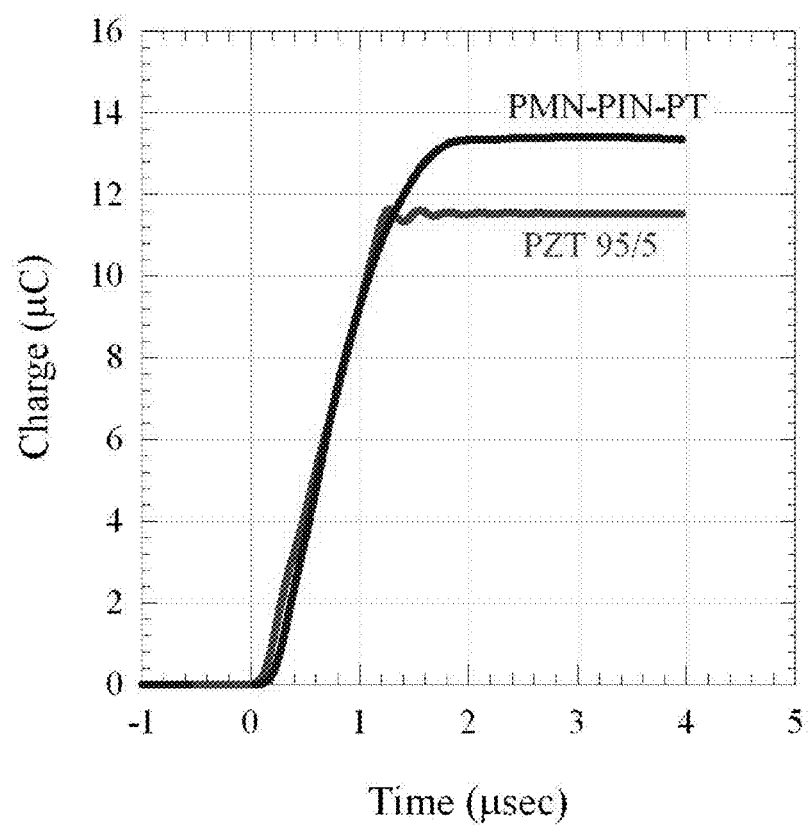
FIG. 3 shows shock-discharge test results comparing the amount of charge discharged over time in response to a mechanical shock for a rhombohedral PIN-PMN-PT single crystal oriented along a <111> direction according to the invention and a 95/5 PZT ceramic material.

FIG. 3 shows shock discharge test results for equivalently sized samples of <111> oriented and polarized 0.26PIN-0.44PMN-0.30PT single crystal and 95/5 PZT ceramic. Compared in the figure are electric depolarization charge generated over time in response to a mechanical shock induced by an explosive. The generators were discharged into a 100Ω resistor. As can be seen in FIG. 3, the single crystal has an increased charge compared to a 95/5 ceramic generator. The increased charge generated by the single crystal will result in more energy delivered to the load.

Figure 4:
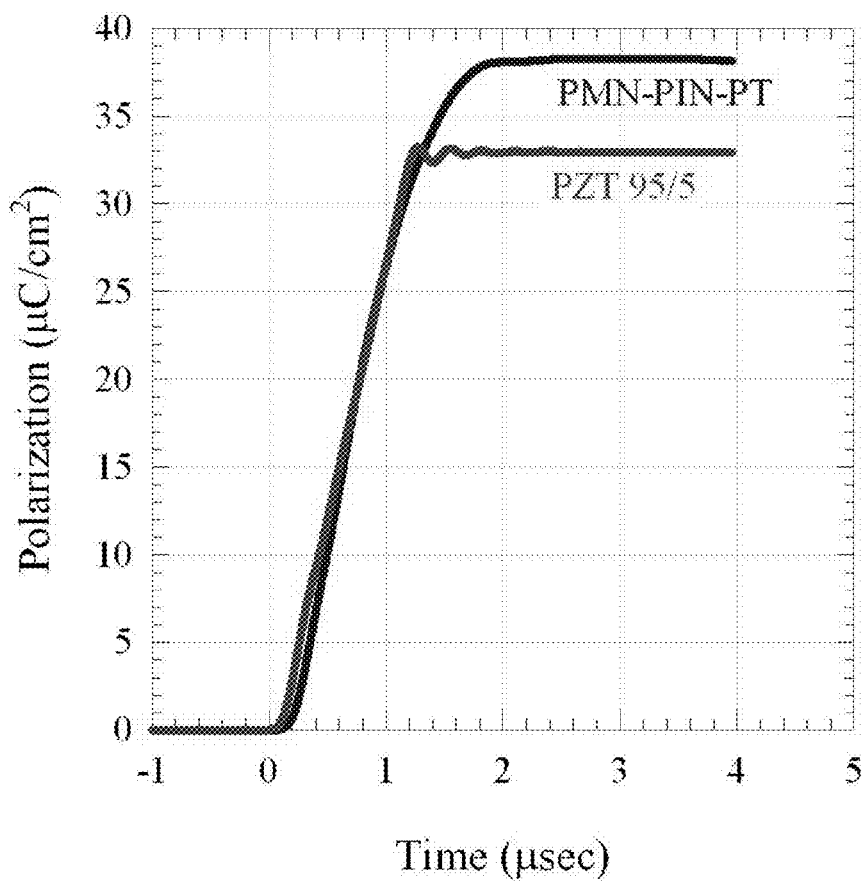
FIG. 4 shows shock-discharge test results comparing polarization (charge per area) discharged in response to a mechanical shock for a rhombohedral PIN-PMN-PT single crystal oriented along a <111> direction and a 95/5 PZT ceramic material.

FIG. 4 shows test results comparing the amount of polarization (i.e. charge per unit area) released during explosively-driven shock-discharge measurements of a 0.26PIN-0.44PMN-0.30PT single crystal oriented along a <111> direction and a 95/5 PZT ceramic material. In these experiments a shock wave was used to depolarize the material under test through a near short-circuit resistive load (100 Ohm).

Referring to FIGS. 3 and 4, the amount of charge released from the single-crystal was significantly larger than that for the standard ceramic (38 $\mu C/cm^2$ versus 33 $\mu C/cm^2$). The polarization inferred from these shock-discharge tests is smaller than measured from the hysteresis loops. This is most likely due to losses such as conduction through the ceramic or crystal or corona discharge losses that can occur during mechanically induced shock-discharge. Despite these losses the crystal still delivered more charge than the ceramic.

In another embodiment, a 1-3 composite is formed that consists of single crystal rods or bars of any of the above compositions aligned in a matrix. The matrix can consist of any polymer material. For example, the matrix may include an epoxy, Teflon, polypropylene, polycarbonate, polyimide, polyvinylidene fluoride (PVDF), or co- or ter-polymers based on PVDF. In one embodiment, the single crystal bars are formed by injection molding and sintering a ceramic pre-form, bonding a seed crystal to the top of the pre-form, and heating to nucleate and grow the crystal. The grown crystal may be further processed by dicing with a diamond saw, and filling the kerfs with the polymer matrix.

In any embodiment of this invention, the ferroelectric generator element made from the materials discussed above can be configured so that the shock wave propagation direction is either perpendicular or parallel to the polarization direction or between perpendicular and parallel to the polarization direction.

While the foregoing specification illustrates and describes exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A high energy density single crystal, comprising:
   a PIN-PMN-PT ferroelectric single crystal oriented and polarized along a single crystallographic directions;
   wherein the PIN-PMN-PT ferroelectric single crystal is a rhombohedral PMN-PIN-PT ferroelectric single crystal oriented and polarized singularly along a <111> crystallographic direction and the high energy density single crystal has a remnant polarization value larger than 38 $\mu C/cm^2$.

2. The crystal of claim 1, wherein the PIN-PMN-PT ferroelectric single crystal has a composition of $xPb(In_{1/2}Nb_{1/2})O_3$-$yPb(Mg_{1/3}Nb_{2/3})O_3$-$zPbTiO_3$ with $0 \leq x \leq 0.5$, $0 \leq y \leq 1$, and $0.2 \leq z \leq 0.6$.

3. The crystal of claim 2, further comprising:
   an effective amount of PbO additions to facilitate crystal growth.

4. The crystal of claim 3, wherein the PbO is added in an amount greater than zero and up to and including 10 mol %.

5. A method of forming a high energy density single crystal, comprising:
   growing a PIN-PMN-PT single crystal along a first crystallographic direction; and
   orienting and polarizing the PIN-PMN-PT single crystal along a second cyrstallographic directions;
   wherein the PIN-PMN-PT ferroelectric single crystal is a PMN-PIN-PT ferroelectric single crystal oriented and polarized singularly along a <111> or <110> crystallographic direction and the high energy density single crystal has a remnant polarization value larger than 38 $\mu C/cm^2$.

6. The method of claim 5, wherein the PIN-PMN-PT single crystal is grown by solid state growth.

7. A high energy density single crystal, comprising:
   a PIN-PMN-PT ferroelectric single crystal oriented and polarized along a single crystallographic direction;
   wherein the PIN-PMN-PT ferroelectric single crystal is an orthorhombic PMN-PIN-PT ferroelectric single crystal oriented and polarized singularly along a <110> crystallographic direction and the high energy density single crystal has a remnant polarization value larger than 38 $\mu C/cm^2$.

8. The crystal of claim 7, wherein the PIN-PMN-PT ferroelectric single crystal has a composition of $xPb(In_{1/2}Nb_{1/2})O_3$-$yPb(Mg_{1/3}Nb_{2/3})O_3$-$zPbTiO_3$ with $0 \leq x \leq 0.5$, $0 \leq y \leq 1$, and $0.2 \leq z \leq 0.6$.

9. The crystal of claim 8, further comprising:
   an effective amount of PbO additions to facilitate crystal growth.

10. The crystal of claim 9, wherein the PbO is added in an amount greater than zero and up to and including 10 mol %.

11. The crystal of claim 5, wherein the PIN-PMN-PT ferroelectric single crystal has a composition of $xPb(In_{1/2}Nb_{1/2})O_3$-$yPb(Mg_{1/3}Nb_{2/3})O_3$-$zPbTiO_3$ with $0 \leq x \leq 0.5$, $0 \leq y \leq 1$, and $0.2 \leq z \leq 0.6$.

12. The crystal of claim 11, further comprising:
   an effective amount of PbO additions to facilitate crystal growth.

13. The crystal of claim 12, wherein the PbO is added in an amount greater than zero and up to and including 10 mol %.

* * * * *